US 10,444,923 B2

(12) United States Patent
Ao

(10) Patent No.: US 10,444,923 B2
(45) Date of Patent: Oct. 15, 2019

(54) TOUCH SENSING DEVICE

(71) Applicant: HOSIDEN CORPORATION, Yao-shi, Osaka (JP)

(72) Inventor: Hitoshi Ao, Yao (JP)

(73) Assignee: HOSIDEN CORPORATION, Yao-Shi, Osaka (JP)

( * ) Notice: Subject to any disclaimer, the term of this patent is extended or adjusted under 35 U.S.C. 154(b) by 0 days.

(21) Appl. No.: 16/041,308

(22) Filed: Jul. 20, 2018

(65) Prior Publication Data

US 2019/0042022 A1 Feb. 7, 2019

(30) Foreign Application Priority Data

Aug. 1, 2017 (JP) .................................. 2017-149441

(51) Int. Cl.
*G06F 3/041* (2006.01)
*G06F 3/044* (2006.01)
(Continued)

(52) U.S. Cl.
CPC ............ *G06F 3/044* (2013.01); *G06F 1/1643* (2013.01); *G06F 3/0414* (2013.01); *H03K 17/9625* (2013.01)

(58) Field of Classification Search
CPC combination set(s) only.
See application file for complete search history.

(56) References Cited

U.S. PATENT DOCUMENTS

2009/0128501 A1  5/2009  Lazaridis et al.
2010/0231367 A1  9/2010  Cruz-Hernandez et al.
(Continued)

FOREIGN PATENT DOCUMENTS

EP    1691263 A1    8/2006
EP    2447812 A2    5/2012
(Continued)

OTHER PUBLICATIONS

Extended European Search Report for European Application No. EP 18184552.0, published by the European Patent Office (EPO), dated Nov. 28, 2018, including corresponding Communication, 4-page Annex, Information on Search Strategy, and 3-page EPO Form 1703.

*Primary Examiner* — Van N Chow
(74) *Attorney, Agent, or Firm* — Kilyk & Bowersox, P.L.L.C.

(57) ABSTRACT

A touch sensing device including an panel including an operation face, a touch sensor fixed to the panel, a circuit board being spaced from the opposite face opposite to the operation face of the panel, an electronic component on a first face of the board, an opposing part in opposing spaced relation to a second face of the board, a coupling member coupling the panel to the board on an outer side relative to the touch sensor and the electronic component, and a switch between the second face of the board and the opposing part. An optical path extends from the electronic component through the touch sensor and the panel. The board relatively approaches the opposing part in accordance with the forward movement of the panel and relatively moves away from the opposing part in accordance with the backward movement of the panel. The switch produces or changes an output signal in accordance with the approach of the board.

19 Claims, 4 Drawing Sheets

(51) Int. Cl.
*G06F 1/16* (2006.01)
*H03K 17/96* (2006.01)

(56) References Cited

U.S. PATENT DOCUMENTS

| | | |
|---|---|---|
| 2011/0053653 A1 | 3/2011 | Tho et al. |
| 2013/0201127 A1 | 8/2013 | Abe et al. |
| 2013/0293499 A1 | 11/2013 | Chang et al. |
| 2014/0036166 A1 | 2/2014 | Kurasawa et al. |
| 2014/0104216 A1* | 4/2014 | Adachi ............... G06F 3/041 345/173 |
| 2016/0062523 A1* | 3/2016 | Jeong ............... G02F 1/133308 349/12 |

FOREIGN PATENT DOCUMENTS

| | | |
|---|---|---|
| EP | 3324275 A1 | 5/2018 |
| WO | 2017010171 A1 | 1/2017 |

* cited by examiner

TOUCH SENSING DEVICE

CROSS-REFERENCE TO RELATED APPLICATION

The present application claims priority under 35 U.S.C. § 119 of Japanese Patent Application No. 2017-149441 filed on Aug. 1, 2017, the disclosure of which is expressly incorporated by reference herein in its entirety.

BACKGROUND OF THE INVENTION

Field

The invention relates to touch sensing devices.

Background Art

A conventional touch sensing device is described in WO 2017/010171. The touch sensing device includes a capacitive touch sensor, a circuit board, a switch for detecting a pressing operation, and a movable part. The circuit board is disposed in opposing spaced relation to the touch sensor. The switch is mounted on the circuit board and below the touch sensor. The movable portion is disposed between the touch sensor and the switch. When the touch sensor is pressed, the touch sensor presses the movable portion, and the movable portion turns on the switch.

SUMMARY OF INVENTION

In the above touch sensing device, the switch is mounted on the face on the touch sensor side of the circuit board, and the movable portion is interposed between the touch sensor and the switch. Therefore, it is not possible to use the face on the touch sensor side of the circuit board as a region for mounting other components.

The invention provides a touch sensing device capable of mounting an electronic component, other than a switch for detecting a pressing operation, on a face on the touch sensor side of a circuit board.

A touch sensing device of one aspect of the invention includes an operation panel, a touch sensor, a circuit board, an electronic component, a circuit-board opposing part, a coupling member, and a detection switch. The operation panel is configured to make a forward movement and a backward movement in a thickness direction thereof. The operation panel includes an operation face and an opposite face opposite to the operation face. The touch sensor is fixed to the operation panel. The circuit board includes a first face and a second face opposite to the first face, and the first face faces and is spaced from the opposite face of the operation panel. The electronic component is a light emitting device or a display device. The electronic component is mounted on the first face of the circuit board such as to form an optical path extending from the light emitting device or display device through the touch sensor and through the operation face of the operation panel. The circuit-board opposing part is in opposing spaced relation to the second face of the circuit board. The circuit board is configured to relatively approach the circuit-board opposing part in accordance with the forward movement of the operation panel and relatively move away from the circuit-board opposing part in accordance with the backward movement of the operation panel. The coupling member is located on an outer side relative to the touch sensor and the electronic component and couples the operation panel to the circuit board. The detection switch is provided between the second face of the circuit board and the circuit-board opposing part. The detection switch is configured to produce an output signal, or change an output signal being produced, in accordance with the approach of the circuit board to the circuit-board opposing part.

The touch sensing device of this aspect is configured such that the operation panel is coupled to the circuit board outside the touch sensor, and the detection switch is provided between the second face of the circuit board and the circuit-board opposing part. This configuration allows mounting the electronic component on the first face of the circuit board.

The detection switch may be mounted on the second face of the circuit board. Addition of a circuit board to mount the detection switch, separately from the circuit board to mount the electronic component, would result in an increased number of components by the additional circuit board. This is in contrast with the touch sensing device of this aspect of the invention, in which the electronic component is mounted on the first face of the circuit board and the detection switch is mounted on the second face of the circuit board. This arrangement obviates an additional circuit board for the detection switch and accordingly decreases the number of components of the touch sensing device. As a variant, the circuit-board opposing part may serve as the circuit board for mounting the detection switch.

The touch sensing device of any of the above aspects may further include a vibration generator fixed to the opposite face of the operation panel. The vibration generator may be configured to generate vibration in response to an output signal from at least one of the touch sensor and the detection switch. In the touch sensing device of this aspect, when a user touches the touch sensor and/or presses the operation panel with the detection object, the vibration generator generates and transfers vibration to the operation panel and further to a detection object via the operation panel.

The touch sensing device of any of the above aspects may include a housing and a cushion between the operation panel and the housing. The housing may have an opening, and the operation face of the operation panel may be exposed through the opening. The cushion may be located on an outer side relative to the operation face. In the touch sensing device of this aspect, the cushion makes it harder for vibration generated by the vibration generator to be transmitted to the housing.

The touch sensor may include a plurality of electrodes including first and second designated electrodes, and an output signal from each electrode may change as a detection object approaches. In this case, the touch sensing device of any of the above aspects may further include a detector. The detector may be configured to perform a first process predetermined in accordance with the first designated electrode, in response to a change in an output signal from the first designated electrode, and in response to receipt of an output signal from the detection switch or a change in an output signal from the detection switch. The detector may also be configured to perform a second process predetermined in accordance with the second designated electrode, in response to a change in an output signal from the second designated electrode, and in response to receipt of an output signal from the detection switch or a change in an output signal from the detection switch. The touch sensing device of this aspect makes it possible to perform the first processing with a combination of (1) a first touch detected by the touch sensor through the first designated electrode and (2) a pressing operation detected by the detection switch, and to perform the second process with a combination of (1) a second touch detected by the touch sensor through the second designated electrode and (2) a pressing operation detected by the detection switch. This configuration makes it possible to share the detection switch as an input part for performing the first processing and the second processing, leading to reduced number of components of the touch sensing device.

BRIEF DESCRIPTION OF DRAWINGS

The present invention can be even more fully understood with the reference to the accompanying drawings which are intended to illustrate, not limit, the present invention.

DESCRIPTION OF EMBODIMENTS

Various embodiments of the invention will now be described.

First Embodiment

Figure 1:
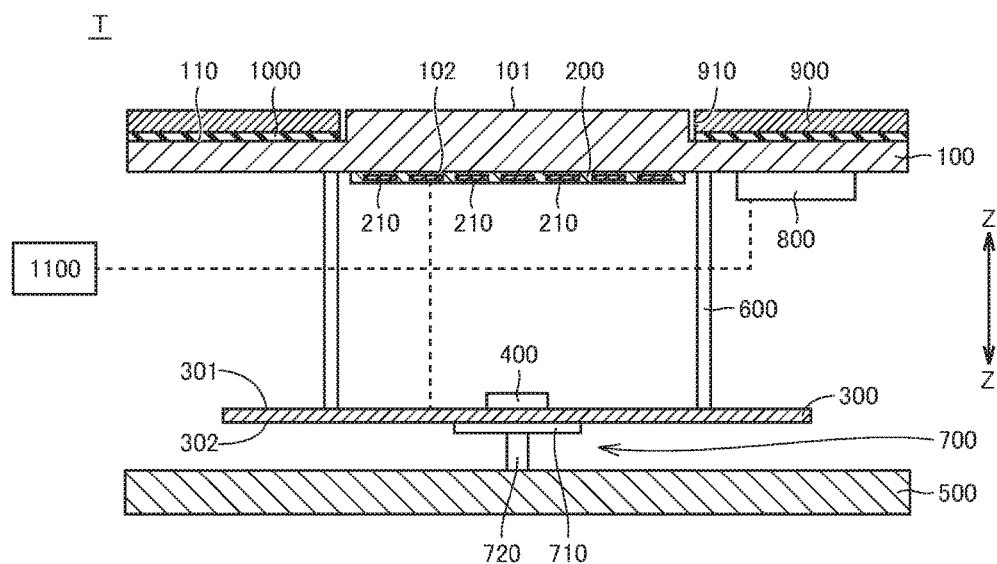
FIG. 1 is a schematic sectional view of a touch sensing device according to a first embodiment of the invention.
Figure 2:
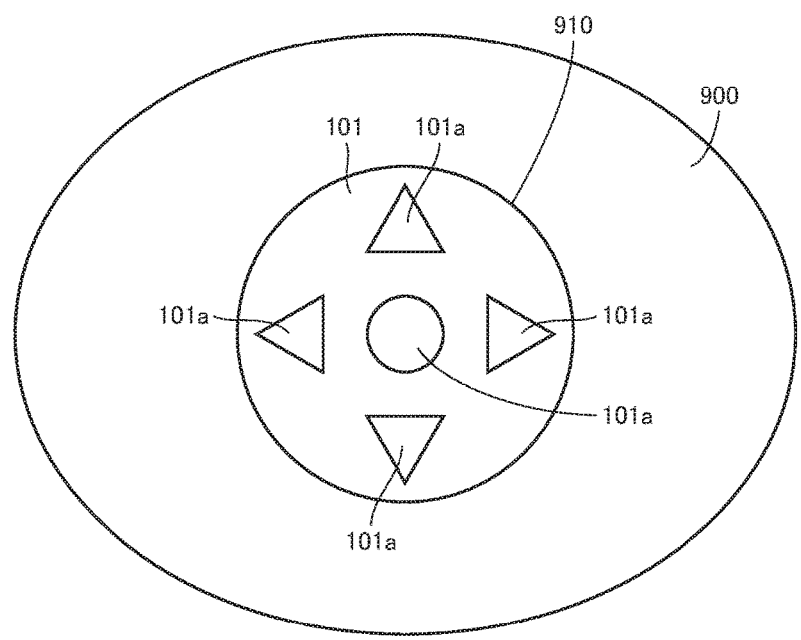
FIG. 2 is a schematic plan view of the touch sensing device.

A touch sensing device T according to various embodiments including a first embodiment of the invention will be described with reference to FIGS. 1 and 2. FIGS. 1 and 2 show the touch sensing device T of the first embodiment. FIG. 1 indicates the Z-Z' direction, which is the moving direction and the thickness direction of the operation panel of the touch sensing device T and corresponds to a first direction in the claims.

The touch sensing device T includes an operation panel 100 and a capacitive touch sensor 200. The operation panel 100 is constituted by one or more plastic plates or films. Each plastic plate or film is made of e.g. polycarbonate (PC), polystyrene (PS), cycloolefin copolymer (COC), cycloolefin polymer (COP), polymethyl methacrylate (PMMA), polypropylene (PP), a polymer alloy in which more than one of the above materials are blended together, or the like. The operation panel 100 may be flat in its entirety, curved at least in part, or bent at least in part. The operation panel 100 can make reciprocating motion in the Z-Z' direction, i.e. make a forward movement in the Z' direction and a backward movement in the Z direction. The operation panel 100 may have an operation face 101 on the Z-direction side and an opposite face 102 on the opposite side (Z'-direction side). The operation face 101 is the face that a user touches with a finger, a stylus, or other means (which will be hereinafter referred to as a "detection object") in order to give input to be detected by the touch sensor 200. A user can also press the operation face 101 downward (in Z' direction). When the operation face 101 is pressed, the operation panel 100 make the forward movement.

The operation face 101 may be provided with at least one operation part 101a. The operation part 101a may be a protrusion or a recess on the operation face 101. The operation part 101a may be formed by ornamental printing, or by providing ornamental printing on a surrounding area of the operation part 101a. FIG. 2 shows an arrangement that five operation parts 101a are provided on the operation face 101, more particularly one columnar operation part 101a at the center of the operation face 101 and four triangular prism-shaped operation parts 101a around the columnar operation part 101a.

The touch sensor 200 is located on the Z'-direction side relative to the operation face 101 of the operation panel 100. The touch sensor 200 may be 1) fixed to the opposite face 102 of the operation panel 100 as shown in FIG. 1, or alternatively 2) provided inside the operation panel 100. In arrangement 2), the touch sensor 200 may be held by and between the plastic plates or films of the operation panel 100, or may be insert molded inside the operation panel 100.

The touch sensor 200 includes a plurality of electrodes 210. The electrodes 210 may be arranged at spaced intervals on a single plane as viewed in plan from Z-direction side of the operation face 101 of the operation panel 100 (this view may also be referred to simply as plan view) (see FIG. 1). Alternatively, the electrodes 210 includes a plurality of electrodes 210 arranged at spaced intervals on a first plane and a plurality of electrodes 210 arranged at spaced intervals on a second plane. In this case, the electrodes 210 on the first plane may intersect the electrodes 210 on the second plane in plan view. The first and second planes are at different heights in Z-Z' direction. With either arrangement of the electrodes 210, the touch sensor 200 may have configuration (A) or (B) as follows:

(A) When a detection object approaches at least one of the electrodes 210, there arises a change in the electrostatic capacitance between the approached electrode 210 and the detection object. This capacitance change in turn changes the output signal (voltage or current) being outputted from the approached electrode 210.

(B) The electrodes 210 includes at least one pair of electrodes 210 (pair electrodes 210) that are adjacent to each other or intersect each other in plan view, one of which is a drive electrode (Tx electrode) and the other of which is a detection electrode (Rx electrode). The drive electrode and the detection electrode of each pair are capacitively coupled to each other. When a detection object approaches the at least one set of pair electrodes 210 (drive and detection electrodes), there arises a change in the electrostatic capacitance between the approaching drive electrode and detection electrode. This capacitance change in turn changes the output signal (voltage or current) being outputted from the approached electrode 210.

The touch sensing device T further includes an electronic component 400 and a circuit board 300. The circuit board 300 faces and is spaced in the Z-Z' direction from, the opposite face 102 of the operation panel 100. The circuit board 300 has a first face 301 on the Z-direction side and a second face 302 on the Z'-direction side, i.e. on the opposite side to the first face 301. The first face 301 of the circuit board 300 faces the opposite face 102 of the operation panel 100.

The electronic component 400 is a light emitting deice, such as a light-emitting diode (LED) or a set of LEDs, or a display device, such as an organic light-emitting diode (OLED) display or a liquid crystal display. The electronic component 400 is mounted on the first face 301 of the circuit board 300 such as to be positioned on the Z'-direction side relative to the operation face 101 of the operation panel 100 and the touch sensor 200. The electronic component 400 accordingly can emit light to the operation face 101 of the operation panel 100 and the touch sensor 200, forming an optical path extending from the electronic component 400 through the touch sensor 200 and through the operation face 101 of the operation panel 100. It is therefore preferable that at least a part of the operation panel 100 have sufficient translucency to allow light from the electronic component 400 to pass through the corresponding part of the operation face 101. The term "translucency" as used herein should be understood as including transparency. Where the electronic component 400 is a light emitting device, the operation panel 100 may have configuration 1) or 2): 1) at least a part of the operation panel 100 from and including the operation face 101 to and including the opposite face 102 has translucency, i.e. light from the electronic component 400 can pass through anywhere in the operation face 101 of the operation panel 100; or 2) the operation face 101 is provided with the above-described at least one operation part 101a, and the operation part 101a and a portion of the operation panel 100 on Z'-direction side relative to the operation part 101a have translucency, i.e. light from the electronic component 400 can pass only through the operation part 101a of the operation panel 100. Where the electronic component 400 is a display device, it is preferable that at least a part of the operation panel 100 from and including the operation face 101 to and including the opposite face 102 has translucency. The display device is configured to display desired visual information on the operation face 101. Where the operation face 101 itself is not provided with an operation part 101a, the display unit may be configured to display an image of an operation part (virtual operation panel) on the operation face 101, for example, but is not limited thereto.

The touch sensing device T further includes a circuit-board opposing part 500. The circuit-board opposing part 500 faces and is spaced in the Z-Z' direction from, the second face 302 of the circuit board 300. The circuit-board opposing part 500 may be a part of the housing of the touch sensing device T, a circuit board, a plate-like member, or the like, for example, but is not limited thereto.

The touch sensing device T further includes at least one coupling member 600. The at least one coupling member 600 is located on an outer side relative to the touch sensor 200 and the electronic component 400 and couples the operation panel 100 to the circuit board 300. The coupling member 600 may be a loop-shaped body of inner size larger than outer size of the touch sensor 200. Alternatively, a plurality of the coupling members 600 is arranged in a loop-shape surrounding the touch sensor 200, and each coupling member 600 couples the operation panel 100 to the circuit board 300. The at least one coupling member 600 may be provided integrally with the operation panel 100 or with the circuit board 300. In the former case, the at least one coupling member 600 may preferably made of identical or similar plastic material to that of the operation panel 100.

As the circuit board 300 is coupled to the operation panel 100 with the at least one coupling member 600 as described above, the circuit board 300 is relatively movable toward the circuit-board opposing part 500 (movable in Z' direction) in accordance with the forward movement of the operation panel 100, and also relatively movable away from the circuit-board opposing part 500 (movable in Z direction) in accordance with the backward movement of the operation panel 100.

The touch sensing device T further includes a detection switch 700. The detection switch 700 is provided between the second face 302 of the circuit board 300 and the circuit-board opposing part 500. In accordance with the approach of the circuit board 300 toward the circuit-board opposing part 500, the detection switch 700 generates an output signal or changes the output signal (voltage or current) being outputted from the detection switch 700.

More particularly, the detection switch 700 may have one of the following configurations (A) to (D), for example:

Configuration (A): As illustrated in FIG. 1, the detection switch 700 includes a pressure-sensitive element 710 and a plunger 720. The pressure-sensitive element 710 is mounted on the second face 302 of the circuit board 300. The plunger 720 is interposed between the pressure-sensitive element 710 and the circuit-board opposing part 500. In the detection switch 700 of this configuration, when the circuit board 300 approaches the circuit-board opposing part 500, the pressure-sensitive element 710 and the plunger 720 are pressed by and between the circuit board 300 and the circuit-board opposing part 500, so that the plunger 720 applies pressure to the pressure-sensitive element 710. When receiving pressure from the plunger 720, the pressure-sensitive element 710 becomes distorted, and then generates and outputs an output signal corresponding to the above pressure or changes the currently outputting output signal in accordance with the above pressure. When the pressure from the plunger 720 is released (pressing operation of the operation panel 100 is released), the pressure-sensitive element 710 exerts a restoring force to push back the plunger 720, the circuit board 300, the coupling member 600, and the operation panel 100 in the Z direction, and the operation panel 100 thus makes the backward movement.

Configuration (B): The detection switch 700 is a tactile switch mounted on the second face 302 of the circuit board 300. The detection switch 700 includes an operation part in abutment with the circuit-board opposing part 500. When the circuit board 300 approaches the circuit-board opposing part 500, the detection switch 700 is compressed by and between the circuit board 300 and the circuit-board opposing part 500 and becomes distorted. The detection switch 700 is thus switched on and generates and outputs an output signal. When the compression of the tactile switch is released (pressing operation on the operation panel 100 is released), the tactile switch exerts a restoring force to push back the circuit board 300, the coupling member 600, and the operation panel 100 in the Z direction, and the operation panel 100 thus makes the backward movement.

Configuration (C): The detection switch 700 may include a magnetic sensor, which is mounted on the second face 302 of the circuit board 300, and a magnetic member, which is provided at the circuit-board opposing part 500. In this case, when the circuit board 300 approaches the circuit-board opposing part 500, the magnetic member accordingly approaches the magnetic sensor, and the magnetic sensor generates and outputs an output signal or changes the currently outputting output signal (voltage or current).

Configuration (D): The detection switch 700 is mounted on the second face 302 of the circuit board 300. The detection switch 700 includes a light emitting device and a light receiving element. The light emitting device is configured to emit light, within the infrared or of other wavelengths, to the circuit-board opposing part 500. The light receiving element is configured to receive infrared or other light reflected by the circuit-board opposing part 500 to convert the light into an output signal. In this configuration, the output signal from the light receiving element changes in accordance with the approach of the circuit board 300 toward the circuit-board opposing part 500.

In the detection switch 700 of configuration (C) or (D) above, it is preferable to provide an urging member, e.g. a coil spring, between the circuit board 300 and the circuit-board opposing part 500. In this case, the urging member is compressed by and between the circuit board 300 and the circuit-board opposing part 500. When the compression of the urging member is released (pressing operation of the operation panel 100 is released), the urging member exerts a restoring force to push back the circuit board 300, the coupling member 600, and the operation panel 100 in the Z direction, and the operation panel 100 thus makes the backward movement.

When the circuit-board opposing part 500 is a circuit board, the detection switch 700 of any of the above aspects may be mounted on the circuit-board opposing part 500, rather than on the second face 302 of the circuit board 300.

Particularly, the detection switch 700 of configuration (A) may preferably be modified such that the pressure-sensitive element 710 is mounted on the circuit-board opposing part 500 and the plunger 720 is interposed between the circuit board 300 and the pressure-sensitive element 710.

The detection switch 700 of configuration (B) may preferably be modified such that the operation part of the detection switch 700 is in abutment with the circuit board 300, rather than with the circuit-board opposing part 500.

The detection switch 700 of configuration (C) may modified be configured such that the magnetic sensor is mounted on the circuit-board opposing part 500, rather than on the circuit board 300, and that the magnetic member is provided at the circuit board 300, rather than at the circuit-board opposing part 500.

The detection switch 700 of configuration (D) may preferably be modified such that the light emitting device is configured to emit infrared light to the circuit board 300, and that the light receiving element is configured to receive infrared light reflected by the circuit board 300 to convert the light into an output signal.

The touch sensing device T may further include a vibration generator 800. The vibration generator 800 is fixed to the opposite face 102 of the operation panel 100. The vibration generator 800 may have at least one of the following configurations (1) and (2):

(1) The vibration generator 800 is configured to generate vibration in response to a change in the output signal of the touch sensor 200 and transfer the vibration to the operation panel 100.

(2) The vibration generator 800 is configured to generate vibration in response to the output signal of the detection switch 700 or in response to a change in the output signal of the detection switch 700, and transfer the vibration to the operation panel 100.

The vibration generator 800 may be omitted.

The touch sensing device T may further include a housing 900. The housing 900 has an opening 910. The operation face 101 of the operation panel 100 is exposed through the opening 910. In this case, the operation panel 100 may further include a peripheral portion 110 around the operation face 101. The peripheral portion 110 faces the peripheral area of the opening 910 of the housing 900 in Z-Z' direction. Where an electronic device (not shown) is provided with the touch sensing device T accommodated in the housing of the electronic device, the housing 900 may be omitted.

The touch sensing device T may further include a cushion 1000. The cushion 1000 is interposed between the peripheral portion 110 of the operation panel 100 and the peripheral area of the opening 910 of the housing 900. In other words, the cushion 1000 is held between the peripheral portion 110 of the operation panel 100 and the peripheral area of the opening 910 of the housing 900. The cushion 1000 is configured to absorb vibration of the operation panel 100 (vibration generated by the vibration generator 800 and/or other kind of vibration) to reduce transmission of the vibration to the housing 900, and also absorb vibration of the housing 900 to reduce transmission of the vibration to the operation panel 100. Where the vibration generator 800 is omitted, the cushion 1000 may still be provided between the peripheral portion 110 of the operation panel 100 and the peripheral area of the opening 910 of the housing 900 in order to absorb other kind of vibration than that by the vibration generator 800 described above. The cushion 1000 may be omitted.

Figure 3A:
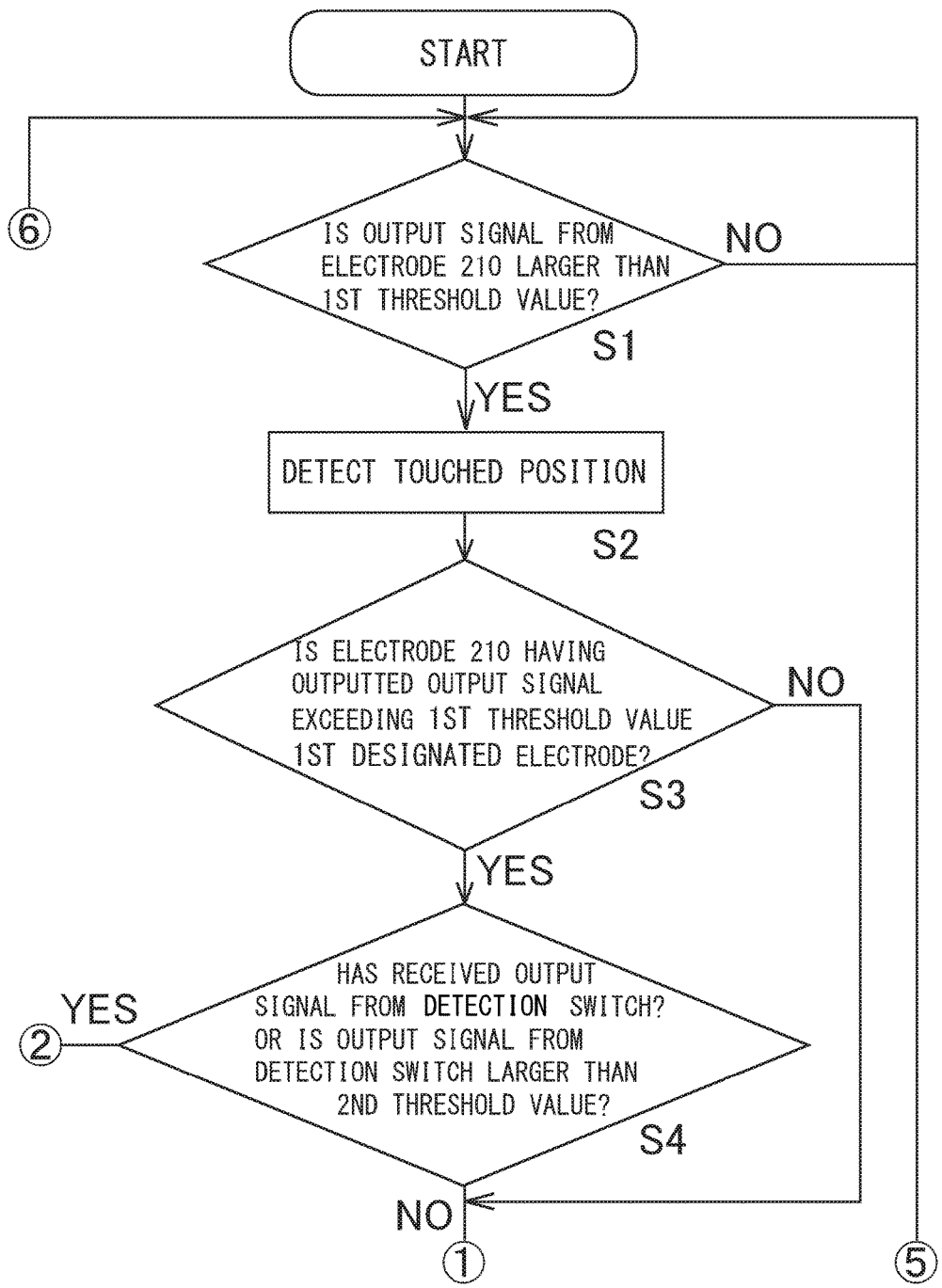
FIG. 3A is a first part of a flowchart representing a process conducted by a detector of the touch sensing device.
Figure 3B:
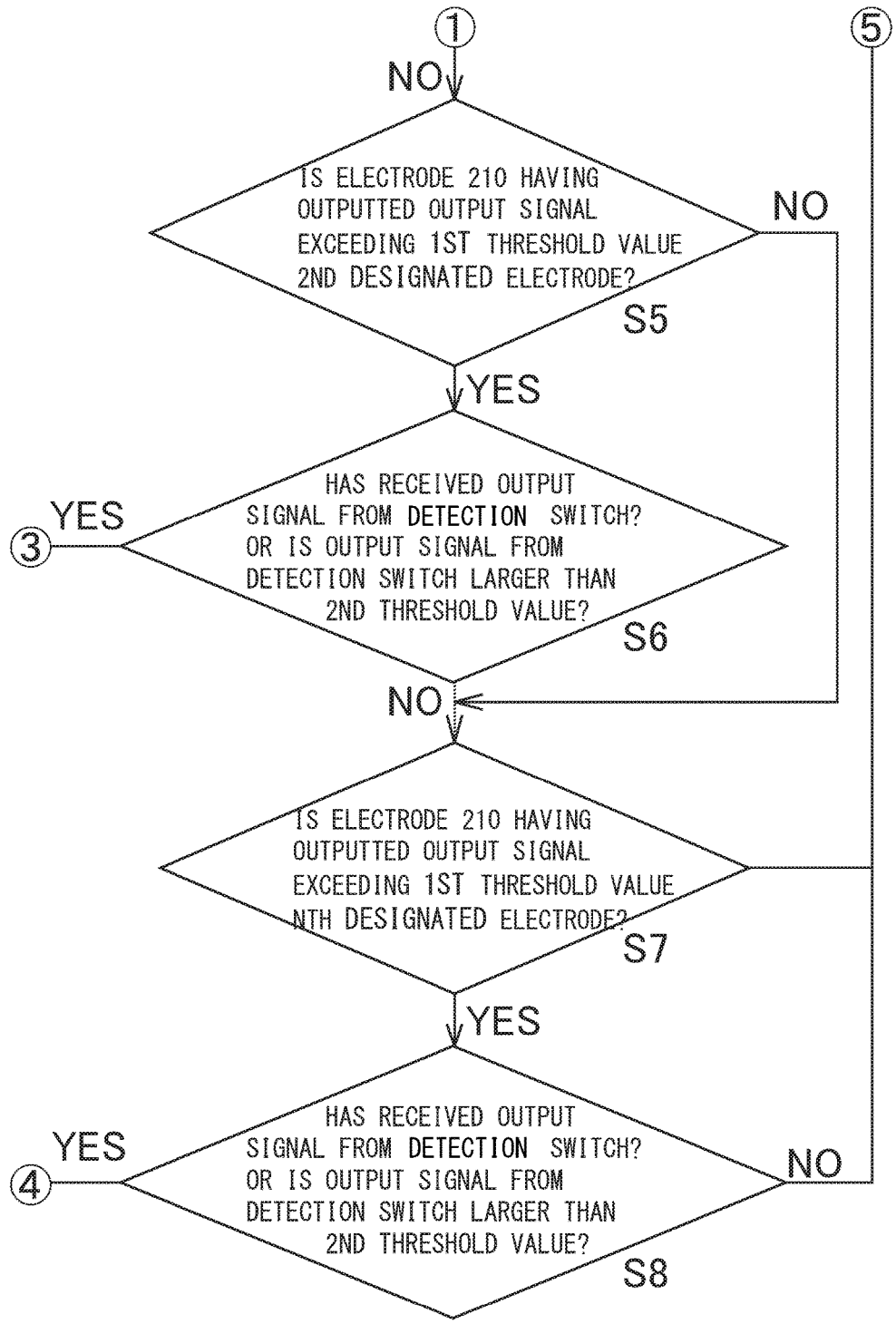
FIG. 3B is a second part of the flowchart continued from FIG. 3A.
Figure 3C:
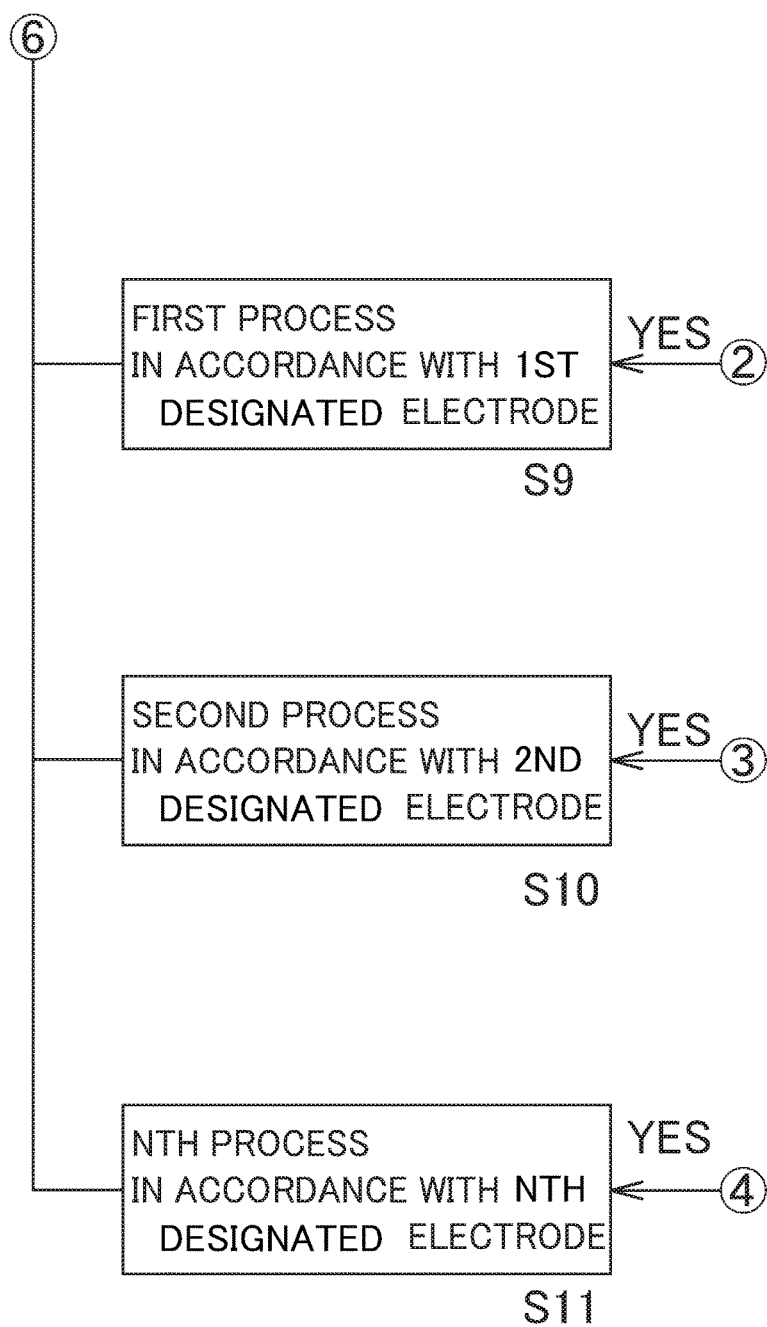
FIG. 3C is a third part of the flowchart continued from FIGS. 3A and 3B.

The touch sensing device T may further include a detector 1100. The detector 1100 is constituted by a logic circuit, such as an IC, or alternatively by software to be processed by a processor. The detector 1100 is electrically connected to at least the touch sensor 200, the electronic component 400, and the detection switch 700. Where the touch sensing device T includes the vibration generator 800, the detector 1100 is electrically connected also to the vibration generator 800. While the detector 1100 may be, but is not required to be, mounted on the first face 301 or the second face 302 of the circuit board 300. FIGS. 3A to 3C show a flowchart representing a non-limiting example of a process conducted by the detector 1100 of the touch sensing device T. Some possible configurations of the detector 1100 will be now described referring to FIGS. 3A to 3C.

Where the touch sensor 200 has configuration (A) described above, the detector 1100 may be configured to execute the following process steps. The detector 1100 sequentially receives output signals from the plurality of electrodes 210 of the touch sensor 200, amplifies the signals, and determines whether each of the amplified signals (hereinafter referred to as an "amplified signal") exceeds a first threshold value stored in a memory of the detector 1100 (Step S1). When it is determined that the amplified signal exceeds the first threshold value, the detector 1100 detects the coordinate position at which the detection object has approached the particular electrode 210 having outputted the output signal exceeding the first threshold value (which may be hereinafter referred to simply as an "particular electrode") (Step S2) the coordinate position of a touch on the operation face 101 is the point in the operation face 101 that is located on the Z-direction side relative to the particular electrode 210. In this case, the coordinate position of the touched point in the operation face 101 may be detected on the basis of more than one of the particular electrodes 210 that have each outputted an output signal exceeding the first threshold value.

Where the touch sensor 200 has the configuration (B) described above, the detector 1100 may be configured to execute the following process steps. The detector 1100 sequentially supplies drive pulses to the drive electrodes, amplifies output signals that are sequentially provided by the detecting electrodes (electrodes 210) in accordance with the supplied drive pulses, and determines whether each of the amplified signals (hereinafter referred to as an "amplified signal") exceeds a first threshold value stored in a memory of the detector 1100 (Step S1). If it is determined in step S1 that the amplified signal exceeds the first threshold value, the detector 1100 detects that a detection object has approached the intersection of the detection electrode having outputted the output signal exceeding the first threshold value and the drive electrode having supplied the corresponding drive pulse, i.e. detects the coordinate position of the touched point in the operation face 101, which point is on the Z-direction side of the intersection (Step S2).

In addition to the detection of the coordinate position (steps S1 and S2) of the touched point according to any of the above aspects, the detector 1100 may be configured to further execute the following process steps: The electrodes 210 includes at least one designated electrode 210, information of which is prestored in a memory of the detector 1100 or other memory, and the detector 1100 determines referring to the information in the memory whether the particular electrode(s) 210 (which may be a detecting electrode) having outputted an output signal exceeding the first threshold value in step S1 is the designated electrode(s) 210 (step S3). If it is determined in step S3 that such particular electrode(s) 210 is the designated electrode(s) 210, the detector 1100 determines whether it has received an output signal from the detection switch 700 or whether there is a change in the output signal from the detection switch 700 (i.e. whether the output signal exceeds a second threshold value stored in the memory) (step S4). If it is determined in step S4 that the detector 1100 has received an output signal from the detection switch 700 or the output signal from the detection switch 700 has exceeded the second threshold value, the detector 1100 performs predetermined processing, such as turning on or off of an electronic apparatus external to the touch sensing device T, turning on or off of the electronic component 400, predetermined program processing in the memory, etc. (step S9).

The electrodes 210 may include a plurality of the designated electrodes 210, namely a first, second, . . . nth designated electrodes 210, information of which is prestored in a memory of the detector 1100 or other memory. In this case, in addition to the detection of the coordinate position (steps S1 and S2) of the touched point according to any of the above aspects, the detector 1100 may be configured to further execute the following process steps: The detector 1100 determines referring to the information in the memory whether a particular electrode 210 (which may be a detecting electrode) having outputted an output signal exceeding the first threshold value in step S1 is the first designated electrode 210 (step S3). If it is determined in step S3 that such particular electrode is the first designated electrode 210, then the detector 1100 determines whether it has received an output signal from the detection switch 700 or whether there is a change in the output signal from the detection switch 700 (i.e. whether the output signal exceeds the second threshold value stored in the memory) (step S4). If it is determined in step S4 that the detector 1100 has received an output signal from the detection switch 700 or the output signal from the detection switch 700 has exceeded the second threshold value, then the detector 1100 performs a first processing predetermined in accordance with the first designated electrode 210, such as turning on or off of an electronic apparatus external to the touch sensing device T, turning on or off of the electronic component 400, performing a predetermined program processing in the memory, etc. (step S9). If it is determined in step S3 that such particular electrode is not the first designated electrode 210, or if it is determined in step S4 that the detector 1100 has not received an output signal from the detection switch 700 or that the output signal from the detection switch 700 has not exceeded the second threshold value, then the detector 1100 determines referring to the information in the memory whether the particular electrode 210 is the second designated electrode 210 (step S5). If it is determined in step S5 that such particular electrode is the second designated electrode 210, then the detector 1100 executes a similar process to that of step S4 (step S6). If it is determined in step S6 that the detector 1100 has received an output signal from the detection switch 700 or the output signal from the detection switch 700 has exceeded the second threshold value, the detector 1100 performs a second processing predetermined in accordance with the second designated electrode 210, such as turning on or off of an electronic apparatus external to the touch sensing device T, turning on or off of the electronic component 400, performing a predetermined program processing in the memory, etc. (step S10). If it is determined in step S5 that such particular electrode is not the second designated electrode 210, or if it is determined in step S6 that the detector 1100 has not received an output signal from the detection switch 700 or that the output signal from the detection switch 700 has not exceeded the second threshold value, then the detector 1100 determines referring to the information in the memory whether the particular electrode 210 is the nth designated electrode 210 (step S7). If it is determined in step S7 that such particular electrode is the nth designated electrode 210, then the detector 1100 executes a similar process to that of step S4 (step S8). If it is determined in step S8 that the detector 1100 has received an output signal from the detection switch 700 or the output signal from the detection switch 700 has exceeded the second threshold value, the detector 1100 performs a nth processing predetermined in accordance with the nth designated electrode 210, such as turning on or off of an electronic apparatus external to the touch sensing device T, turning on or off of the electronic component 400, performing a predetermined program processing in the memory, etc. (step S11). If it is determined in step S8 that the detector 1100 has not received an output signal from the detection switch 700 or that the output signal from the detection switch 700 has not exceeded the second threshold value, then the detector 1100 repeats the above determination steps from step S1. The first, second, . . . and nth processing may preferably be, but is not required to be, different from each other. Where the electrodes 210 include only two designated electrodes 210, namely the first and second designated electrodes 210, steps S7, S8 and S11 may be omitted. Steps S5 to S8, S10, and/or S11 may be omitted from the process of FIGS. 3A-3C.

Steps S3 to S11 described above of the detector 1100 may be replaced with the following process steps: In addition to the detection of the coordinate position (steps S1 and S2) of the touched point according to any of the above aspects, the detector 1100 determines whether it has received an output signal from the detection switch 700 or whether the output signal exceeds the second threshold value stored in the memory. If it is determined that the detector 1100 has received such output signal or that the output signal has exceeded the second threshold value, the detector 1100 detects that the operation face 101 of the operation panel 100 is pressed down, i.e. in the Z' direction.

The at least one designated electrode 210 may be, but is not required to be, disposed on the Z'-direction side relative to the operation part 101a on the operation face 101 of the operation panel 100.

Where the touch sensing device T further includes the vibration generator 800, the detector 1100 may be configured to further execute at least one of the following process steps: (1) turning on the vibration generator 800 for a predetermined time to transfer the generated vibration to the operation panel 100 in response to a change in an output signal from an electrode 210 of the touch sensor 200 (e.g., when the output signal of the electrode 210 exceeds the first threshold value); and (2) turning on the vibration generator 800 for a predetermined time to transfer the generated vibration to the operation panel 100 upon receipt of an output signal from the detection switch 700 or of change in the output signal of the detection switch 700 (e.g., when the output signal from the detection switch 700 exceeds the second threshold value).

The detector 1100 may be omitted. In this case, the detector 1100 may be replaced with a controller or other component of an electronic apparatus.

The touch sensing device T configured as described above provides the following technical features and effects.

Technical feature (1): The touch sensing device T includes the detection switch 700 for detecting pressing operation of the operation face 101 of the operation panel 100 and also is configured such as to allow mounting the electronic component 400 on the first face 301 of the circuit board 300 (the face on the touch sensor 200 side). This is because the coupling member 600 surrounds the touch sensor 200 and couples the operation panel 100 to the circuit board 300, and the detection switch 700 is disposed between the second face 302 of the circuit board 300 and the circuit-board opposing part 500.

Technical feature (2): The touch sensing device T has a reduced number of components for the following reasons. In an aspect where the detection switch 700 is mounted on the second face 302 of the circuit board 300, the circuit board 300 may be shared by the electronic component 400 and the detection switch 700, reducing the number of component of the touch sensing device T as compared to a case of requiring respective circuit boards for mounting the electronic component 400 and the detection switch 700. Also, in an aspect where the touch sensing device T includes the detector 1100 that performs a processing predetermined in accordance with each designated electrode 210 when detecting a change exceeding the first threshold value in an output signal from each designated electrode 210 and when detecting an output signal from the detection switch 700 or detecting a change in the output signal from the detection switch 700 exceeding the second threshold value, it is possible to share the single detection switch 700 as an input part for performing a plurality of processes, thereby reducing the number of parts of the touch sensing device T.

Technical feature (3): In an aspect where the touch sensing device T includes the vibration generator 800, when a user, having or holding the detection object, touches and/or presses the operation face 101 of the operation panel 100 with the detection object, the vibration generator 800 generates and transfers vibration to the operation panel 100 and further to a detection object. The user thus obtains a tactile feel through the vibration of the detection object.

Technical feature (4): In an aspect where the cushion 1000 is provided between the housing 900 and the operation panel 100, the cushion 1000 not only absorbs vibration of the operation panel 100 to reduce transfer of the vibration to the housing 900, but also absorbs vibration of the housing 900 to reduce transfer of the vibration to the operation panel 100.

The above-described touch sensing device is not limited to the above-described embodiments but may be modified in any manner within the scope of the claims. Specific modification examples will be described below.

The electronic component of the invention may be a light emitting device or a display device as described above, or may be an electronic component of other kind. In an aspect where the electronic component of the invention is a light emitting device or a display device, no non-translucent member that completely blocks the light path for the light emitting device or the display device is provided on the light path. In other words, only a translucent member or members, such as a retardation plate or a low reflection plate, can be disposed on the light path for the light emitting device or the display device. The light path may include an intermediate light path from the light emitting device or display device to the touch sensor, there may be nothing on the intermediate light path, as shown in FIG. 1.

It should be appreciated that the touch sensing device of the above embodiments and variants thereof are described above by way of examples only. The materials, shapes, dimensions, numbers, arrangements, and other configurations of the constituents of the touch sensing device may be modified in any manner if they can perform similar functions.

The present invention can include any combination of these various features or embodiments above and/or below as set-forth in sentences and/or paragraphs. Any combination of disclosed features herein is considered part of the present invention and no limitation is intended with respect to combinable features.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

REFERENCE SIGNS LIST

T: touch sensing device
100: operation panel
101: operation face
101a: operation part
102: opposite face
110: peripheral portion
200: touch sensor
210: electrode (designated electrode)
300: circuit board
301: first face
302: second face
400: electronic component
500: circuit-board opposing part
600: coupling member
700: detection switch
710: pressure-sensitive element
720: plunger
800: vibration generator
900: housing
910: opening
1000: cushion
1100: detector

What is claimed is:

1. A touch sensing device comprising:

an operation panel being configured to make a forward movement and a backward movement in a thickness direction thereof, the operation panel including an operation face and an opposite face opposite to the operation face;

a touch sensor fixed to the operation panel;

a circuit board including a first face and a second face opposite to the first face, the first face facing and being spaced from the opposite face of the operation panel;

an electronic component being a light emitting device or a display device, the electronic component being mounted on the first face of the circuit board such as to form an optical path extending from the light emitting device or display device through the touch sensor and through the operation face of the operation panel;

a circuit-board opposing part in opposing spaced relation to the second face of the circuit board, the circuit board being configured to relatively approach the circuit-board opposing part in accordance with the forward movement of the operation panel and relatively move away from the circuit-board opposing part in accordance with the backward movement of the operation panel;
a coupling member on an outer side relative to the touch sensor and the electronic component, the coupling member coupling the operation panel to the circuit board; and
a detection switch between the second face of the circuit board and the circuit-board opposing part, the detection switch being configured to produce an output signal, or change an output signal being produced, in accordance with the approach of the circuit board to the circuit-board opposing part.

2. The touch sensing device according to claim 1, wherein the detection switch is mounted on the second face of the circuit board.

3. The touch sensing device according to claim 2, wherein the detection switch includes:
a pressure-sensitive element mounted on the second face of the circuit board, and
a plunger interposed between the pressure-sensitive element and the circuit-board opposing part.

4. The touch sensing device according to claim 1, wherein the detection switch is mounted on the circuit-board opposing part.

5. The touch sensing device according to claim 4, wherein the detection switch includes:
a pressure-sensitive element mounted on the circuit-board opposing part, and
a plunger interposed between the pressure-sensitive element and the circuit board.

6. The touch sensing device according to claim 1, further comprising a vibration generator fixed to the opposite face of the operation panel, the vibration generator being configured to generate vibration in response to an output signal from at least one of the touch sensor and the detection switch.

7. The touch sensing device according to claim 6, further comprising:
a housing having an opening, the operation face of the operation panel being exposed through the opening; and
a cushion between the operation panel and the housing, the cushion being located on an outer side relative to the operation face.

8. The touch sensing device according to claim 1, wherein
the touch sensor includes a plurality of electrodes, the electrodes including first and second designated electrodes,
an output signal from each electrode changes as a detection object approaches,
the touch sensing device further comprises a detector, and
the detector is configured to perform a first process, in response to a change in an output signal from the first designated electrode, and in response to receipt of an output signal from the detection switch or a change in an output signal from the detection switch, and
the detector is configured to perform a second process, in response to a change in an output signal from the second designated electrode, and in response to receipt of an output signal from the detection switch or a change in an output signal from the detection switch.

9. The touch sensing device according to claim 2, wherein
the touch sensor includes a plurality of electrodes, the electrodes including first and second designated electrodes,
an output signal from each electrode changes as a detection object approaches,
the touch sensing device further comprises a detector, and
the detector is configured to perform a first process, in response to a change in an output signal from the first designated electrode, and in response to receipt of an output signal from the detection switch or a change in an output signal from the detection switch, and
the detector is configured to perform a second process, in response to a change in an output signal from the second designated electrode, and in response to receipt of an output signal from the detection switch or a change in an output signal from the detection switch.

10. The touch sensing device according to claim 1, wherein
the touch sensor includes a plurality of electrodes, the electrodes including first and second designated electrodes,
an output signal from each electrode changes as a detection object approaches,
the touch sensing device further comprises a detector, the detector including a memory storing first and second threshold values and information on the first and second designated electrodes, and
the detector is configured to sequentially receive output signals from the electrodes, determine whether each of the signals exceeds the first threshold value, and determine, when it is determined that the output signal exceeds the first threshold value, referring to the information in the memory whether a particular electrode having outputted the output signal exceeding the first threshold value is the first designated electrode,
the detector is further configured to determine, if it is determined that the particular electrode having outputted the output signal exceeding the first threshold value is the first designated electrode, whether the detector has received an output signal from the detection switch or whether the output signal exceeds the second threshold value, and perform a first process if it is determined that the detector has received such output signal from the detection switch or the output signal from the detection switch has exceeded the second threshold value,
the detector is further configured to determine, if it is determined that the particular electrode having outputted the output signal exceeding the first threshold value is not the first designated electrode, referring to the information in the memory whether the particular electrode having outputted the output signal exceeding the first threshold value is the second designated electrode,
the detector is further configured to determine, if it is determined that the particular electrode having outputted the output signal exceeding the first threshold value is the second designated electrode, whether the detector has received an output signal from the detection switch or whether the output signal exceeds the second threshold value, and perform a second process if it is determined that the detector has received such output signal from the detection switch or the output signal from the detection switch has exceeded the second threshold value.

11. The touch sensing device according to claim 2, wherein the touch sensor includes a plurality of electrodes, the electrodes including first and second designated electrodes, an output signal from each electrode changes as a detection object approaches, the touch sensing device further comprises a detector, the detector including a memory storing first and second threshold values and information on the first and second designated electrodes, and the detector is configured to sequentially receive output signals from the electrodes, determine whether each of the signals exceeds the first threshold value, and determine, when it is determined that the output signal exceeds the first threshold value, referring to the information in the memory whether a particular electrode having outputted the output signal exceeding the first threshold value is the first designated electrode, the detector is further configured to determine, if it is determined that the particular electrode having outputted the output signal exceeding the first threshold value is the first designated electrode, whether the detector has received an output signal from the detection switch or whether the output signal exceeds the second threshold value, and perform a first process if it is determined that the detector has received such output signal from the detection switch or the output signal from the detection switch has exceeded the second threshold value, the detector is further configured to determine, if it is determined that the particular electrode having outputted the output signal exceeding the first threshold value is not the first designated electrode, referring to the information in the memory whether the particular electrode having outputted the output signal exceeding the first threshold value is the second designated electrode, the detector is further configured to determine, if it is determined that the particular electrode having outputted the output signal exceeding the first threshold value is the second designated electrode, whether the detector has received an output signal from the detection switch or whether the output signal exceeds the second threshold value, and perform a second process if it is determined that the detector has received such output signal from the detection switch or the output signal from the detection switch has exceeded the second threshold value.

12. The touch sensing device according to claim 8, wherein the operation face of the operation panel includes first and second operation parts, the thickness direction of the operation panel is a first direction, the first direction including:
one side of the first direction being an operation-face side of the operation panel, and
the other side of the first direction being an opposite side to the operation-face side, the first designated electrode is located on the other side of the first direction relative to the first operation part, and the second designated electrode is located on the other side of the first direction relative to the second operation part.

13. The touch sensing device according to claim 9, wherein the operation face of the operation panel includes first and second operation parts, the thickness direction of the operation panel is a first direction, the first direction including:
one side of the first direction being an operation-face side of the operation panel, and
the other side of the first direction being an opposite side to the operation-face side, the first designated electrode is located on the other side of the first direction relative to the first operation part, and the second designated electrode is located on the other side of the first direction relative to the second operation part.

14. The touch sensing device according to claim 1, wherein no non-translucent member that completely blocks the light path is provided on the light path.

15. The touch sensing device according to claim 2, wherein no non-translucent member that completely blocks the light path is provided on the light path.

16. The touch sensing device according to claim 1, wherein only a translucent member is provided on the light path.

17. The touch sensing device according to claim 2, wherein only a translucent member is provided on the light path.

18. The touch sensing device according to claim 1, wherein
the light path includes an intermediate light path from the electronic component to the touch sensor, and
there is nothing on the intermediate light path.

19. The touch sensing device according to claim 2, wherein
the light path includes an intermediate light path from the electronic component to the touch sensor, and
there is nothing on the intermediate light path.

* * * * *